United States Patent
Yamaguchi

(12) 
(10) Patent No.: US 6,316,761 B1
(45) Date of Patent: Nov. 13, 2001

(54) IMAGE READING METHOD HAVING READING CONDITIONS DIFFERENT IN LIGHT QUANTITY

(75) Inventor: Hiroshi Yamaguchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/443,336

(22) Filed: Nov. 19, 1999

(30) Foreign Application Priority Data

Nov. 20, 1998 (JP) .................................................. 10-330898

(51) Int. Cl.$^7$ ..................................................... H01L 27/00
(52) U.S. Cl. ...................................... 250/208.1; 250/559.3
(58) Field of Search ............................... 250/208.1, 559.3, 250/548; 356/399–401; 358/474, 518, 522; 355/55, 56; 382/167, 309, 274, 275

(56) References Cited

U.S. PATENT DOCUMENTS 5,365,353 * 11/1994 Kraft ..................................... 358/518

* cited by examiner

Primary Examiner—Que T. Le

(57) ABSTRACT

There is provided an image reading method comprising the steps of reading an original image photoelectrically under a plurality of reading conditions different in light quantity; obtaining image characteristic values of the original image for the individual reading conditions from image signals read under the individual reading conditions; and absorbing differences in signal level of the image signals under the individual reading conditions using the image characteristic values obtained under the individual reading conditions to thereby align the signal level of the image signals under the individual reading conditions. This method is capable of advantageously absorbing the differences in the image signals (image density data) due to the different reading conditions to align the signal level of the image signals under the individual reading conditions without producing any errors due to the properties of an original reading device when correcting the plurality of image signals read under the plurality of different reading conditions from the differences in the quantity of reading light previously set.

13 Claims, 4 Drawing Sheets

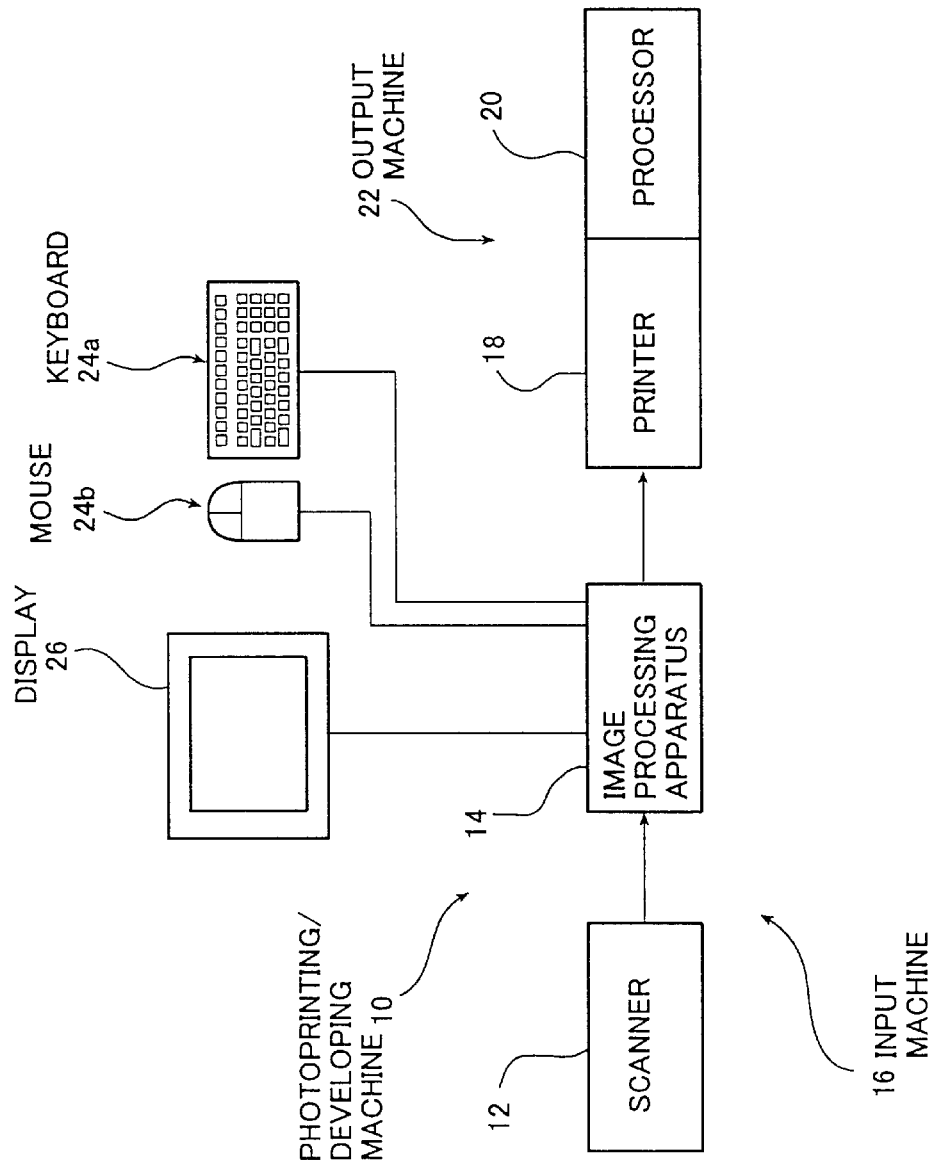

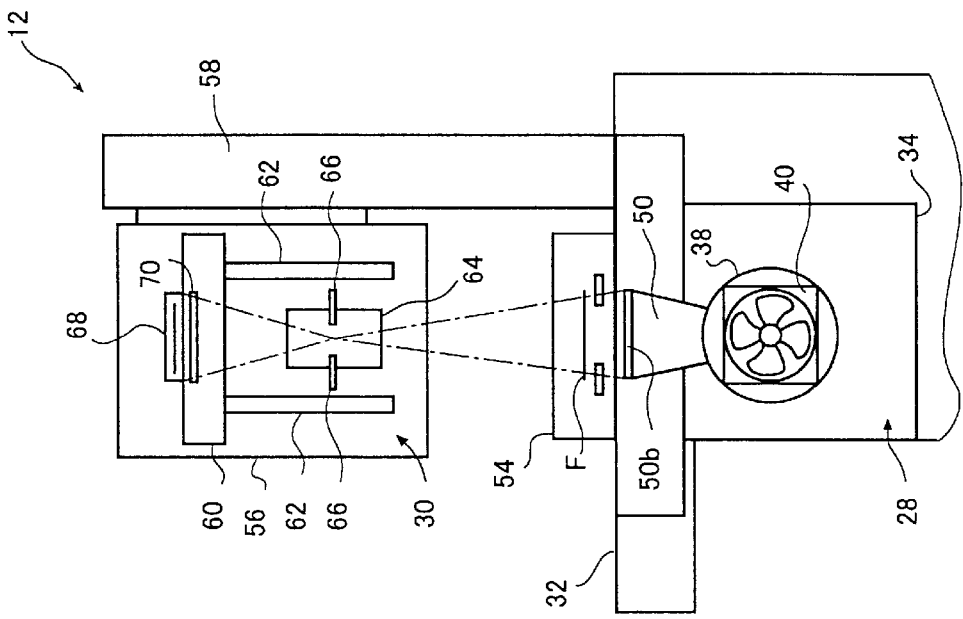
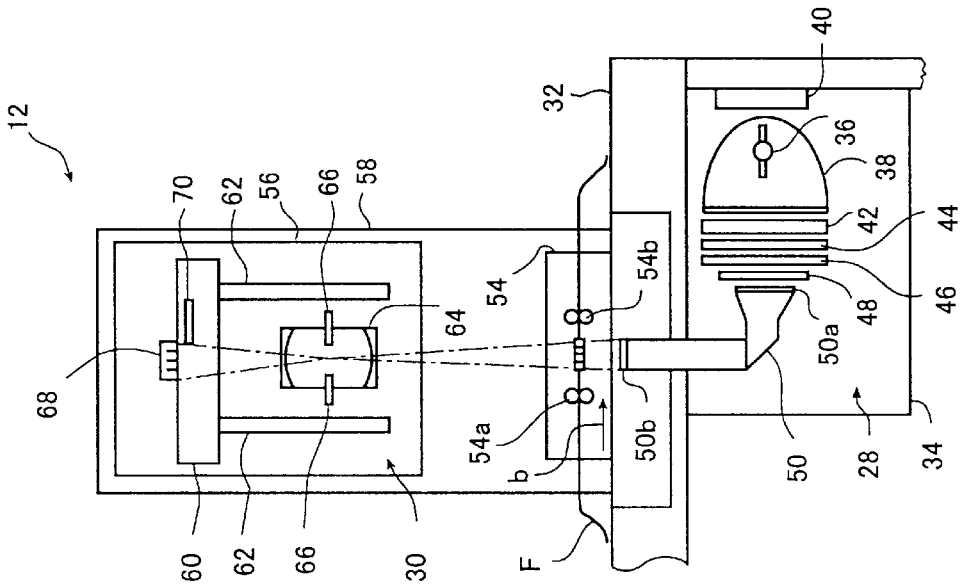

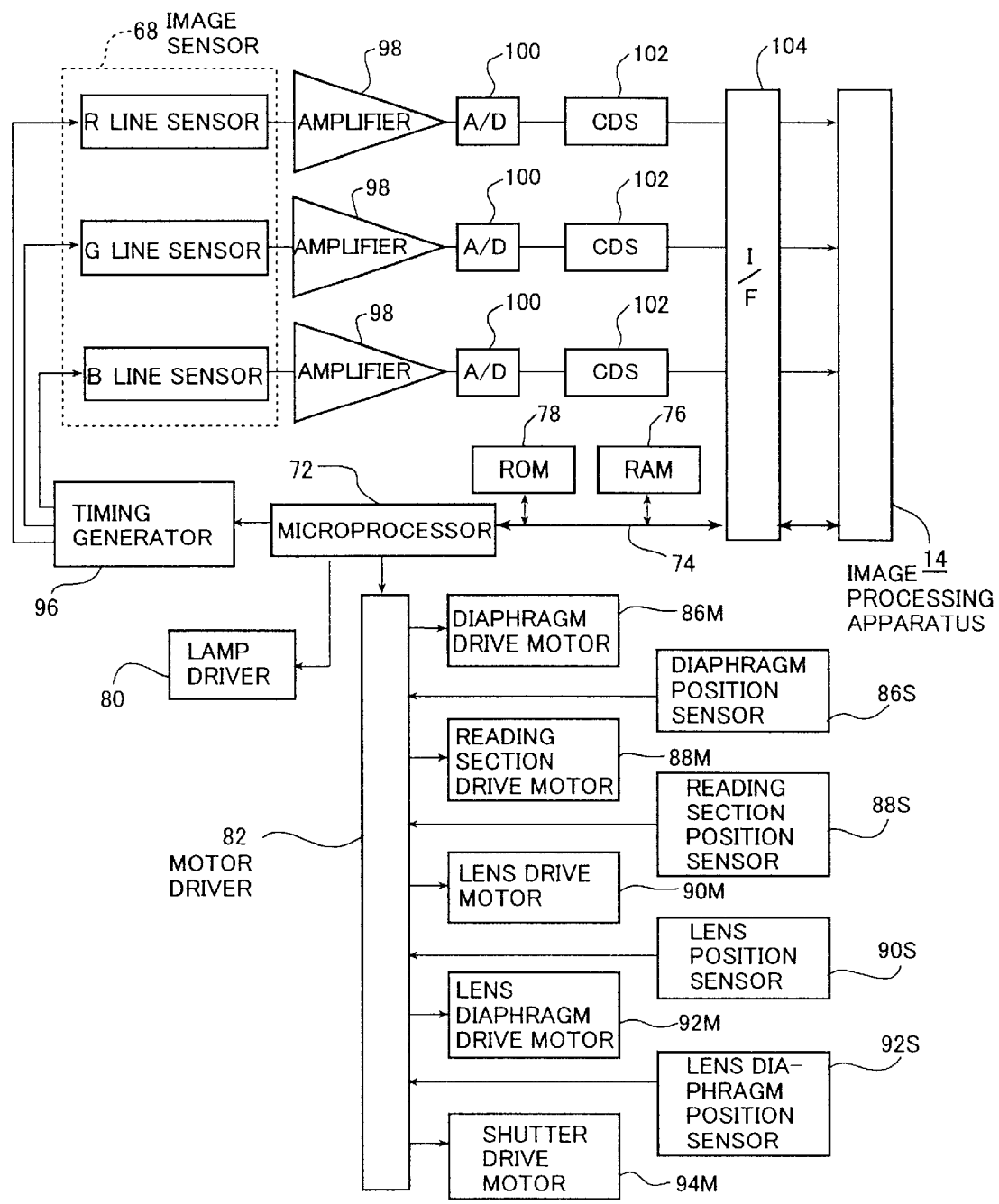

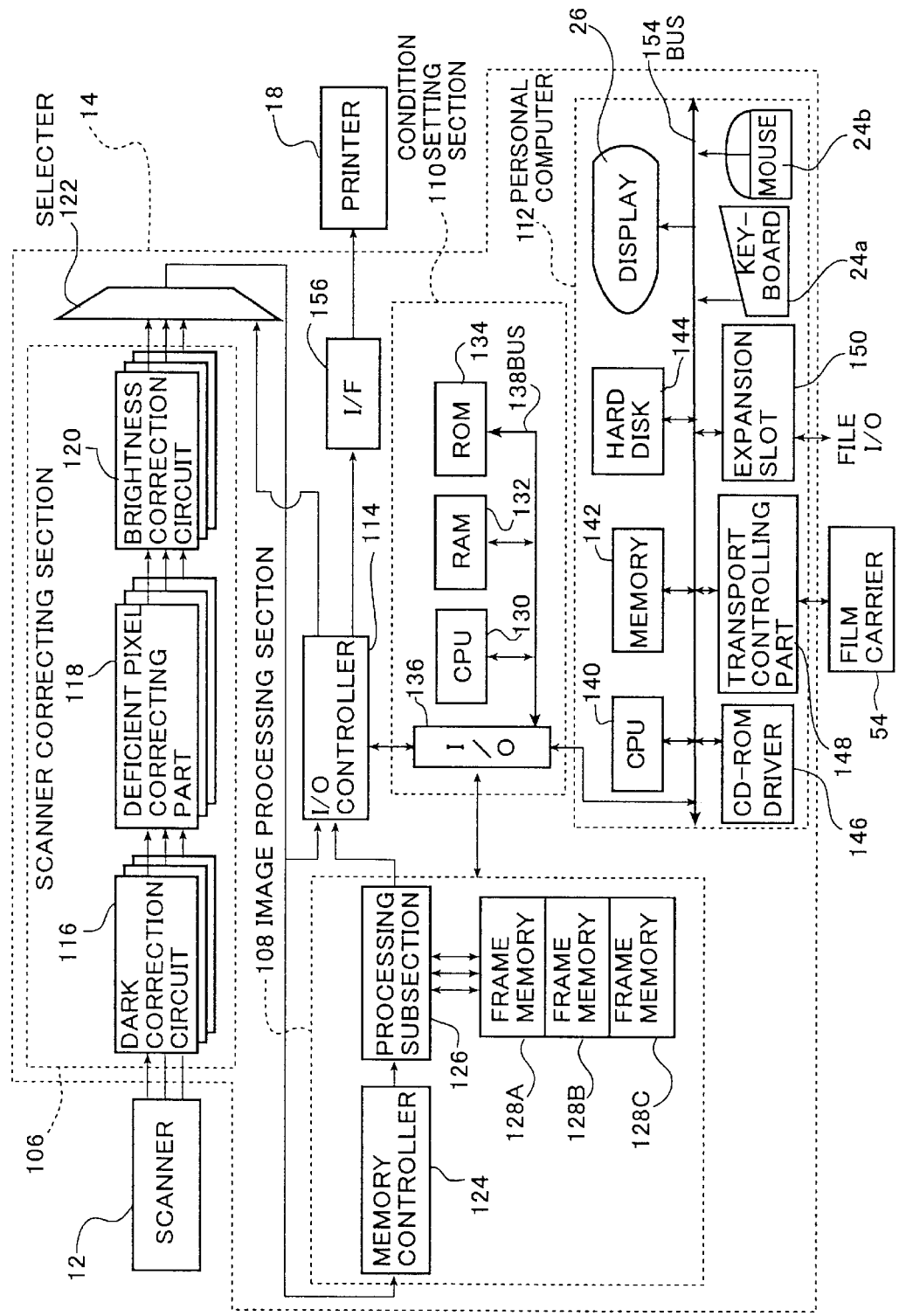

IMAGE READING METHOD HAVING READING CONDITIONS DIFFERENT IN LIGHT QUANTITY

BACKGROUND OF THE INVENTION

This invention relates to the field of image reading technology for typical use with digital photoprinters that read film images photoelectrically to produce prints (photographs) reproducing the images.

Heretofore, the images recorded on photographic films such as negatives and reversals (which are hereinafter referred to simply as "films") have been commonly printed on light-sensitive materials (photographic paper) by means of direct (analog) exposure in which the film image is projected onto the light-sensitive material to achieve its areal exposure.

A new technology has recently been introduced and this is a printer that relies upon digital exposure. Briefly, the image recorded on a film is read photoelectrically, converted to digital image data (image signals) and subjected to various image processing schemes to produce image data (output image signals) for recording purposes; recording light that has been modulated in accordance with the image data (output image signals) is used to scan and expose a light-sensitive material to record a latent image, which is subsequently developed to produce a (finished) print. The printer operating on this principle has been commercialized as a digital photoprinter.

In the digital photoprinter, images are converted to digital image data that are processed to determine the exposing conditions for printing. Hence, the digital photoprinter is capable of performing effective image processing operations such as the correction of washed-out highlights or flat shadows due to the taking of pictures with back light or an electronic flash, sharpening and the correction of color or density failure and this enables the production of high-quality prints that have been impossible to attain by the conventional direct exposure technique. In addition, not only the assembling of plural images and the dividing of a single image but also the compositing of characters on image can be performed by processing the image data and, as a result, prints can be output after various editing and/or processing operations have been performed in accordance with specific uses.

Outputting images as prints (photographs) is not the sole capability of the digital photoprinter; the image data can be supplied into a computer or the like and stored in recording media such as a floppy disk; hence, the image data can be put to various non-photographic uses.

Having these features, the digital photoprinter is basically composed of an image input machine having a scanner (image reading apparatus) and an image processing apparatus, and an image output machine having a printer (an image recording apparatus) and a processor (developing apparatus).

In the scanner, reading light issuing from a light source is allowed to be incident on a film, from which projected light bearing the image recorded on the film is produced and focused by an imaging lens to form a sharp image on an image sensor such as a CCD sensor; the image is then captured by photoelectric conversion and sent to the image processing apparatus as image data for the film (i.e., image data signals) after being optionally subjected to various image processing steps.

In the image processing apparatus, image processing conditions are set on the basis of the image data read with the scanner and image processing as determined by the thus set conditions is performed on the thus read image data and the resulting output image data (output image signals) for image recording are sent to the printer as the exposing conditions.

In the printer, if it is of a type that relies upon exposure by scanning with a light beam, the latter is modulated in accordance with the image data sent from the image processing apparatus and deflected in a main scanning direction as a light-sensitive material is transported in an auxiliary scanning direction perpendicular to the main scanning direction, whereby a latent image is formed as the result of exposure (printing) of the light-sensitive material with the image bearing light beam. Development and other processing as determined in accordance with the light-sensitive material are then performed in the processor to produce a print (photograph) reproducing the image that was recorded on the film.

Not only in the scanner used in the digital photoprinter described above, but also in an image reading apparatus in a system which requires outputting high quality images, it is preferred to capture the densities of the original image at the highest possible density resolution. To this end, image reading need be performed making the best use of the dynamic range of an image sensor such as a CCD sensor provided in the scanner.

Therefore, many apparatuses perform prescan for roughly reading the image prior to fine scan for obtaining output image data for printing purposes. The image data obtained by prescan is used to find the density range or the like of the image, in accordance with which the reading conditions for fine scan as well as the processing conditions of the image data obtained by fine scan (or image processing conditions) are determined.

Therefore, prescan is performed under the condition that all the densities that may be used for recording on an original can be captured. Namely, if a negative film is used as the original, it is required in prescan mode to properly and precisely read the image having a density range so wide as to exceed 3 in terms of the density, including from an under-exposed original to an over-exposed original.

However, there are few image sensors with a wide dynamic range that can read the image having such a wide density range with high precision.

In an apparatus which requires image reading in a density range exceeding the dynamic range of the image sensor capable of proper reading with high precision, a plurality of reading operations advantageously adapted for the images having different density ranges are performed in prescan mode under the reading conditions different in the light quantity as obtained by changing the storage time (exposure time) of the CCD sensor. Based on the results of prescan, it is possible for example to adopt prescanned data obtained under the reading conditions which achieved proper reading, thereby determining the reading conditions for fine scan and the image processing conditions.

In order to reproduce a film image as an output image of higher quality, it is preferred to determine the reading conditions for fine scan and the image processing conditions taking into consideration the film properties including, for example, the base density of the film.

It is difficult to obtain the proper film properties from the image data of one frame. Then, it is preferred to use the image data of a plurality of frames, more preferably of all the frames of a film to thereby find the film properties. That is, the image data of a plurality of frames need be used to set more advantageous reading conditions for fine scan and image processing conditions in view of the film properties.

However, if prescanned data of a plurality of frames obtained under different reading conditions exist, they can not be treated as the identical data when used to set the image processing conditions or the reading conditions for fine scan. Then, setting of the proper reading conditions for fine scan and image processing conditions is not possible.

Even if differences between the prescanned data of the plurality of frames due to the reading conditions for prescan are simply cancelled, there are many cases in which proper image processing conditions or reading conditions for fine scan cannot be set because of the properties of the image sensor including the CCD sensor.

SUMMARY OF THE INVENTION

A first object of the present invention is to solve the prior art problems by providing an image reading method in which an original image having a wide density range such as a negative or reversal film is read photoelectrically under a plurality of reading conditions different in light quantity to thereby enlarge the image reading dynamic range of an original reading device such as a CCD sensor for use in photoelectric reading of the original image, said method being capable of advantageously absorbing differences in image signals (image density data) due to the different reading conditions to align the signal level of the image signals under the individual reading conditions without producing any errors due to the properties of the above device when correcting the plurality of image signals read under the plurality of different reading conditions from the differences in the quantity of reading light previously set.

A second object of the present invention is to provide an image reading method in which prescan is performed under a plurality of reading conditions different in the light quantity to cover a wide density range, and the thus obtained prescanned data is used to determine the reading conditions for fine scan and the image processing conditions, said image reading method being capable of absorbing advantageously the differences of the image data due to the different reading conditions for prescan, thereby setting the proper reading conditions for fine scan and image processing conditions in a consistent manner, even when these conditions are to be set for each frame from the prescanned data of a plurality of frames.

In order to achieve the first object, the present invention provides an image reading method comprising the steps of:
reading an original image photoelectrically under a plurality of reading conditions different in light quantity;
obtaining image characteristic values of said original image for said individual reading conditions from image signals read under said individual reading conditions; and
absorbing differences in signal level of said image signals under said individual reading conditions using said image characteristic values obtained under said individual reading conditions to thereby align the signal level of said image signals under said individual reading conditions.

Said image characteristic values include preferably at least one of an average value in a specified range and a specified point value in a cumulative histogram of said image signals, and an average value of said image signals.

Said differences in said signal level of said image signals are preferably those in the light quantity between said reading conditions.

At least one of a number of reading and a color for reading said original image several times is preferably changed over in accordance with an original type of said original image as said reading conditions for reading said original image several times.

Preferably, a line sensor is used to read said original image photoelectrically under said plurality of reading conditions different in the light quantity to thereby read it with an exposure time that is different between specified lines.

Preferably, said differences in the signal level of said image signals are positional offsets between said lines due to said line sensor.

Preferably, the image reading method further comprises the step of:
selecting one optimal corrected image signal to be output or at least two corrected image signals being combined to be output from a plurality of corrected image signals obtained by aligning the signal level of said image signals under said individual reading conditions.

In order to achieve the second object, reading said original image photoelectrically under the plurality of reading conditions different in the light quantity to thereby align the signal level of said image signals under said individual reading conditions is preferably performed in prescan prior to fine scan that reads said original image photoelectrically to obtain output image signals.

Preferably, the image reading method further comprises the step of:
determining at least one of reading conditions for said fine scan and image processing conditions for image processing schemes to be performed on fine scanned image signals obtained by said fine scan by using corrected prescanned image signals obtained by aligning the signal level of said image signals under said individual reading conditions in said prescan.

Preferably, the image reading method further comprises the step of:
selecting one optimal corrected image signal to be output or at least two corrected image signals being combined to be output from a plurality of corrected image signals as said corrected prescanned image signals, which are obtained by aligning the signal level of said image signals under said individual reading conditions.

In the above embodiments, said image signals are preferably digital density signals.

In order to achieve the second object, the present invention also provides an image reading method for reading an original image photoelectrically, comprising the steps of:
performing prescan under a plurality of reading conditions different in light quantity prior to fine scan for obtaining output image signals;
using image characteristic values of an image obtained by said prescan to absorb differences of prescanned image signals due to said different reading conditions; and
determining at least one of reading conditions for said fine scan and image processing conditions for image processing schemes to be performed on the image signals obtained by said fine scan using corrected prescanned image signals having adsorbed the differences of said image signals.

Said image characteristic values include preferably at least one of an average value of said image signals between two specified % points in a histogram, a specified % point value of said image signals in the histogram, and an average value of said image signals.

At least one of said reading conditions for said fine scan and the image processing conditions are preferably set by using said prescanned image data of a plurality of frames. Even when the image read under optimal reading conditions in accordance with the image density of each frame is selected, the image data of the plurality of frames can be similarly treated by absorbing the differences between the reading conditions for prescan.

BRIEF DESCRIPTION OF THE DRAWINGS

FIG. 1 is a block diagram of an exemplary photoprinting/developing machine for implementing the image reading method of the invention;

FIGS. 2A and 2B are a schematic front view and a schematic side view of a scanner in the photoprinting/developing machine shown in FIG. 1, respectively;

FIG. 3 is a block diagram of an electric system of the scanner shown in FIGS. 2A and 2B; and FIG. 4 is a block diagram of an image processing apparatus in the photoprinting/developing machine shown in FIG. 1.

DETAILED DESCRIPTION OF THE INVENTION

The image reading method of the invention is now described in detail with reference to the preferred embodiments shown in the accompanying drawings.

FIG. 1 shows a block diagram of an exemplary photoprinting/developing machine for implementing the image reading method of the invention.

The photoprinting/developing machine 10 shown in FIG. 1 is the above-mentioned digital photoprinter, and is composed of an input machine 16 having a scanner 12 for photoelectrically reading an image on a film F and an image processing apparatus 14 which subjects image data (image signals) read with the scanner 12 to specified image processing schemes to obtain output image data (output image signals) for printing purposes, as well as an output machine 22 having a printer 18 which performs imagewise exposure of a light-sensitive material (photographic paper) by scanning with light beams modulated in accordance with the image data output from the image processing apparatus 14 (output image signals) to record a latent image and a processor 20 which performs a wet development process and a drying process on the thus exposed light-sensitive material to produce a (finished) print. The input machine 16 is used to implement the image reading method of the invention (hereinafter simply referred to as "reading method").

Connected to the image processing apparatus 14 are a keyboard 24a and a mouse 24b for inputting (setting) various conditions, selecting and commanding a specific processing step and entering a command and so forth for effecting color/density correction, as well as a display 26 for representing the image read with the scanner 12, various manipulative commands and pictures for setting and registering various conditions.

FIGS. 2A and 2B show a schematic front view and a schematic right side view of the scanner 12, respectively.

The scanner 12 comprises a light source section 28 and a reading section 30.

The light source section 28 is loaded into a casing 34 under an operating table 32 of the scanner 12 in the input machine 16. A light source 36 for reading light is located in the casing 34 on the right side as seen from the front of the scanner 12. Various types of light sources used in conventional photoelectric image reading such as a halogen lamp and a metal halide lamp are available as the light source 36.

On the periphery of the light source 36 is provided a reflector 38 to make the light issuing from the light source 36 incident on the film F efficiently. In the casing 34 is also provided a cooling fan 40 to keep the interior thereof cooled to a specified temperature.

A UV/IR cut filter 42 for cutting light having a wavelength in the ultraviolet and infrared regions, a first CC filter 44, a second CC filter 46, a variable diaphragm 48 and a light diffuser box 50 are further provided in the casing 34 downstream in the direction of travel of the light issuing from the light source 36 (hereinafter simply referred to as "downstream").

For proper image reading, the first and second CC filters 44 and 46 use for example color filters or the like to adjust the color components of the reading light issuing from the light source 36 (or light intensity of each wave range) to thereby correct individual differences of the color properties in the light source 36.

The variable diaphragm 48 adjusts the light quantity of the reading light incident on the film F, and is a known one such as throttle plates which come into contact with or go out of contact with each other, an iris diaphragm or an ND filter in which the transmission density varies continuously. Alternatively, a plurality of ND filters having different transmission densities or combination thereof may be used as the variable diaphragm 48, or these ND filters may be used in combination with the throttle plates or the iris diaphragm as described above.

The variable diaphragm 48 is adjusted to a stop-down value set under the previously determined reading conditions for prescan when performing prescan to be described later and to a stop-down value set from the image data obtained by prescan when performing fine scan for obtaining output image data for printing purposes, respectively.

The light diffuser box 50 is a cylinder generally in the shape of the letter L. Both the opening ends (inlet and outlet for the reading light) are closed by light diffuser plates 50a and 50b, respectively. Further, the bent portion is provided with a reflecting mirror for deflecting the light by 90°.

The outlet of the light diffuser box 50 has a slit that extends in the direction in which line CCD sensors of an image sensor 68 to be described later extend. This direction is hereinafter referred to as "main scanning direction". The light incident on the light diffuser box 50 is diffused by the light diffuser plates 50a and 50b, and at the same time, is emitted as slit light that extends in the main scanning direction.

The light source section 28 is located under the operating table 32, as described above.

The keyboard 24a, the mouse 24b and the display 26 are put on the upper surface of the operating table 32.

In the scanner 12, dedicated carriers 54 are available that can be mounted on a specified position of the operating table 32 in accordance with the type or the size of the film used (e.g. whether it is a film of the Advanced Photo System (APS) or a negative or reversal film of 135 size), the format of the film (e.g. whether it is a strip or a slide) and the like. By replacing one carrier with another, the scanner 12 can be adapted to process various kinds of films.

The illustrated scanner 12 reads images by slit scan exposure.

A web of the film F is transported for scanning in the direction shown by an arrow b in FIG. 2A perpendicular to the main scanning direction by means of transport roller pairs 54a and 54b provided on opposite sides of a specified reading position, while being held by the carrier 54 in the reading position corresponding to the outlet of the light diffuser box 50, and is exposed to the reading light in the slit shape coming from the lower side. Thus, the scanner 12 subjects the film F to two-dimensional slit scan with the reading light to produce projected light bearing the image, whereupon the image of each frame of the film F is sequentially captured.

The carrier 54 also serves as a mask for defining the reading light incident on the film F and/or the projected light having passed through the film F in a specified slit shape.

The carrier 54 is provided with sensors for reading image areas and DX codes thereby determining print formats. Necessary information is sent to the image processing apparatus 14.

As is well known, transparent magnetic recording media are preliminarily formed on the film F for APS to record various kinds of information including the film type, cartridge ID, the date when a picture was taken, and the presence or absence of electronic flash when taking the picture. The carrier 54 adapted for the APS is provided with magnetic heads for recording the information or reading the information recorded on the magnetic recording media. The thus read information is sent to the image processing apparatus 14.

The reading section 30 loaded into a casing 56 is located above the operating table 32.

On the upper surface of the operating table 32 is erected an optical frame 58 by which the casing 56 is supported so as to move in a direction in which the casing 56 comes close to or goes away from the operating table 32, namely in the direction in which the light travels through the focuses of a lens unit 64. This direction is hereinafter referred to as "vertically". In the casing 56 is provided a table 60 from which a plurality of support rails 62 are suspended. The support rails 62 support the lens unit 64 so that it can move vertically.

The lens unit 64 is an imaging lens unit composed of a plurality of lenses, and is used to focus the projected light from the film F to form an image on the light-receiving plane of the image sensor 68.

Lens diaphragms 66 are provided between the lenses in the lens unit 64. The lens diaphragms 66 are for example iris diaphragms and are used to adjust the light quantity of the projected light that passes through the lens unit 64 to form an image on the image sensor 68.

The image sensor 68 is fitted on the upper surface of the table 60.

The image sensor 68 is a so-called 3-line color CCD sensor comprising three line CCD sensors provided in the auxiliary scanning direction at a specified distance from each other. Each of the line CCD sensors extends in the main scanning direction and has one of R, G and B color filters on the light incident side. The charge stored in each CCD cell (pixel) of the respective line CCD sensors including R line sensor, G line sensor and B line sensor is transferred sequentially from the corresponding transfer section.

A shutter 70 for obtaining dark correction data of the image sensor 68 is provided upstream of or below the image sensor 68.

The illustrated scanner 12 uses the line CCD sensors as the image sensor to read the film images photoelectrically by slit scan exposure. This is not however the sole case of the invention, and an area CCD sensor may be used to read the images by areal exposure.

In this case, for example, a turret having R, G and B color filters is provided between the light source and the scanner to perform image reading by successively inserting the respective color filters into the light path while holding one frame of the film at a specified reading position, whereupon the image on the film is read as three separate primary colors R, G and B.

FIG. 3 is a schematic view showing the layout of an electric system of the scanner 12.

The scanner 12 has a microprocessor 72 for controlling the scanner 12 as a whole. To the microprocessor 72 are connected a RAM 76 and a ROM 78 (for example EPROM) through a bus 74. A lamp driver 80 and a motor driver 82 are also connected thereto.

The lamp driver 80 is actuated to turn on or off the light source 36 in accordance with the instruction from the microprocessor 72.

On the other hand, to the motor driver 82 are connected a diaphragm drive motor 86M for adjusting the stop-down value by sliding plates 48A and 48B of the variable diaphragm 48; a diaphragm position sensor 86S for detecting the stop-down position of the plates 48A and 48B of the variable diaphragm 48; a reading section drive motor 88M for vertically moving the casing 56 confining the reading section 30; a reading section position sensor 88S for detecting the position of the casing 56 or the reading section 30; a lens drive motor 90M for vertically moving the lens unit 64; a lens position sensor 90S for detecting the position of the lens unit 64; a lens diaphragm drive motor 92M for adjusting the lens diaphragms 66; a lens diaphragm position sensor 92S for detecting the position or stop-down value of the lens diaphragms 66; and a shutter drive motor 94M for changing over the shutter 70 between the full-closed and full-opened states.

When reading the image on the film F by means of the image sensor 68, the microprocessor 72 moves the variable diaphragm 48 by means of the diaphragm drive motor 86M in accordance with the position of the variable diaphragm 48 and the determined reading conditions, thereby adjusting the light quantity of the reading light incident on the film F or the density of the original image.

Further, the microprocessor 72 determines the zoom magnification in accordance with the instruction for changing the magnification or the size of the film F. The casing 56 is vertically moved by means of the reading section drive motor 88M based on the position detection of the casing 56 by the reading section position sensor 88S such that the projected light from the film F can be focused to form an image on the image sensor 68 in accordance with the determined zoom magnification, and the lens unit 64 is also moved vertically by means of the lens drive motor 90M based on the position detection of the lens unit 64 by the lens position sensor 90S, and the lens diaphragm drive motor 92 is driven in accordance with the magnification or other factors to adjust the lens diaphragms 66.

To the image sensor 68 is also connected a timing generator 96 which generates various timing signals or clock signals for actuating the image sensor 68, A/D converters 100 or other components.

The microprocessor 72 gives an instruction to the timing generator 96 in accordance with the set reading conditions so that each line CCD sensor of the image sensor 68 performs image reading for a specified exposure time or storage time (at a specified electronic shutter speed) to store the charge in each CCD cell thereof.

In the scanner 12, one frame (one image) is captured by two scans; one being fine scan for reading the image finely (at high resolution) to obtain output image data to be supplied to the printer 18 for printing and the other being prescan for reading the image roughly (at low resolution) prior to fine scan to thereby determine the reading conditions for fine scan and the image processing conditions.

Prescan is usually performed under reading conditions under which originals having a possibility of being read with the scanner 12 can be all captured, or under which the output is not saturated even in a film having the minimum density. The reading conditions for fine scan are set under which the image can be read making the best use of the dynamic range of the image sensor 68 in such a density range that the output from the image sensor 68 is saturated at a slightly lower density than the minimum density of the frame of interest. Fine scan is performed in accordance with the thus set reading conditions for fine scan.

In the scanner 12 of the input machine 16 for implementing the reading method of the invention, prescan is performed under a plurality of reading conditions different in the light quantity. Thus, film images in a wide density range exceeding 3 in terms of the density can be read precisely and properly from under-exposed ones to over-exposed ones in a consistent manner by enlarging the dynamic range of the image sensor 68 apparently.

As will be described below in detail, in the present invention, image characteristic values based on a plurality of prescanned data having different reading conditions are used to absorb differences in the signal level of the prescanned data (image signals). The signal level of the prescanned data under the individual reading conditions is aligned to obtain corrected prescanned data (corrected prescanned image signals) in which the signal level is aligned. From the thus corrected prescanned data, the reading conditions for fine scan and the image processing conditions are set. Thus, even in the case of determining the image processing conditions of the fine scanned data and so forth using the image data of a plurality of frames, the difference in the signal level of the prescanned data of each frame due to the reading conditions can be absorbed to align the signal level to thereby set the advantageous image processing conditions and so forth. The prescanned data (image data) subjected to arithmetic operations for aligning the signal level by absorbing the differences thereof are preferably digital density signals (density data) that were output from the image sensor 68 and subjected to A/D conversion and Log conversion.

In the illustrated input machine 16 (scanner 12), reading is performed with two types of the storage time that are different at the odd pixel lines (odd lines) and the even pixel lines (even lines) in the auxiliary scanning direction. The microprocessor 72 gives an instruction to the timing generator 96 in accordance with the pixel line to be processed so that each line CCD sensor of the image sensor 68 performs image reading in the odd and even pixel lines with the respective types of corresponding storage time. Namely, in the illustrated case, two types of image reading that are different in the light quantity or storage time are performed in prescan mode.

Thus, odd pixel lines are captured with such a storage time that the output from the image sensor 68 is not saturated even when the image density is extremely low as in the case of under-exposure in a negative film, and even pixel lines are captured with a storage time determined to enable precise detection of the maximum density even when the image density is extremely high.

A plurality of prescan image reading operations performed in the present invention under the conditions different in the light quantity are not limited to the above case, and reading in the odd pixel lines and even pixel lines may be directed to the high and low density images, respectively, or reading may be performed under the reading conditions that are different between the blocks each composed of two or more pixels. Further, the number of the reading conditions is not limited to two, and three different reading conditions corresponding to high density image, standard density image and low density image, respectively, may be used to perform reading sequentially by changing the reading conditions for each pixel or for a plurality of pixels. Alternatively, four or more reading conditions may be used to perform reading, or the reading conditions may be changed between the odd pixels and the even pixels or between the blocks each composed of a plurality of pixels not in the auxiliary scanning direction but in the main scanning direction to thereby perform reading.

In the scanner, if it is of the areal exposure type that performs image reading using the area CCD sensor as described above, not the storage time of the area CCD sensor but the variable diaphragm 48 in the light source section 28 and/or the lens diaphragm 66 in the lens unit 64 may be adjusted to change the quantity of the reading light in prescan thereby performing a plurality of prescan image reading operations having different light quantity conditions.

It should be noted that the storage time of each line CCD sensor may be set and controlled independently from each other in accordance with the original type, color balance and density of the original image.

The number of the reading conditions different in the light quantity to be used in prescan with the image sensor 68 is not particularly limited. The number of image reading to be performed under the reading conditions different in the light quantity, namely the number of reading to be performed several times also is not particularly limited. Further, any colors may be read several times under the reading conditions different in the light quantity. The number of colors to be read also is not particularly limited. Thus, one, two or three of R, G and B colors may be read, or more than three colors may of course be read.

The type of the reading conditions, the number of image reading, and colors to be read several times may be set and changed over in accordance with the type, color balance and density of the original image. Thus, as the reading conditions different in the light quantity used in prescan with the image sensor 68, various parameters can be changed over as described below. The number of image reading with a specified color, for example B may be changed over from twice to three times in accordance with the original type, and the color balance and density of the original image. The colors to be read may be changed over from B to G or from only B to B and G without changing the number of image reading. Alternatively, the number of image reading and the colors to be read may be changed over at a time, for example from twice, B to three times, G or from twice, B to three times, B and twice, G.

The signal outputs from the image sensor 68 are amplified by amplifiers 98 and converted to digital image data in the A/D converters 100.

The thus converted digital image data are processed by correlation double sampling circuits (CDSs) 102 and sequentially output to the image processing apparatus 14 via an interface (I/F) circuit 104. It should be noted that the CDSs 102 subtract the field through data representing the level of the field through signals from the image data to obtain image data correctly corresponding to the amount of the charge stored in each CCD cell of the image sensor 68.

Photometric signals of R, G and B are output in parallel from the image sensor 68. The signal processing system has also three lines each including an amplifier 98, an A/D converter 100 and a CDS 102. The image data of R, G and B are output in parallel from the I/F circuit 104.

FIG. 4 shows a block diagram of the image processing apparatus 14.

The image processing apparatus 14 comprises a scanner correcting section 106, an image processing section 108, a condition setting section 110, a personal computer 112 and an input/output (I/O) controller 114.

The scanner correcting section 106 has a three-line signal processing system to process the image data of R, G and B output in parallel from the scanner 12, and comprises dark correction circuits 116, deficient pixel correcting parts 118 and brightness correction circuits 120.

The dark correction circuits 116 perform dark (dark current) correction of the image sensor 68. Thus, the image data (or data representing the dark output level in each CCD cell (pixel) of the image sensor 68) output from the scanner 12 while the shutter 70 is closed is measured and stored for each pixel. Dark correction is performed by subtracting the stored data about the dark output level from the image data of the film F output from the scanner 12.

The deficient pixel correcting parts 118 store for example the addresses of deficient pixels having abnormal outputs as obtained from a reference original. When reading the film F, the image data of the deficient pixels are generated by interpolation with the image data of the surrounding pixels.

The brightness correction circuits 120 correct unevenness of the image sensor 68 for each pixel. The image data of the film F output from the scanner 12 is corrected using gains for correcting the output unevenness of each pixel as obtained by the reference original.

The image sensor 68 has three line CCD sensors that are spaced apart in the auxiliary scanning direction, which causes a lag in the timing of starting output of each image data of R, G and B from the scanner 12. In the scanner correcting section 106, the output timing of the image data is delayed with the delayed time that is different for each color component, so that the image data of R, G and B in the same pixel line of the image can be output in the same timing.

The image data output from the scanner correcting section 106 is input to a selector 122. The input end of the selector 122 is also connected to the data output end of the I/O controller 114, from which the image data input from an external unit is input to the selector 122.

The output end of the selector 122 is connected to the I/O controller 114 and the image processing section 108. The selector 122 selectively outputs the supplied image data to the I/O controller 114 and the image processing section 108.

The image processing section 108 comprises a memory controller 124, a processing subsection 126, and three frame memories 128A, 128B and 128C.

Each of the frame memories 128A, 128B and 128C has a capacity with which fine scanned image data of one frame can be stored. The image data input from the selector 122 is processed in the processing subsection 126, sent to the I/O controller 114, and optionally stored any of the three frame memories 128A, 128B and 128C. The memory controller 124 performs address control for storing the image data in the frame memories 128A, 128B and 128C so that the input image data of each pixel is aligned in a specified order to be stored in the storage areas of the frame memories 128A, 128B and 128C.

The processing subsection 126 subjects the image data obtained by fine scan (hereinafter referred to as "fine scanned data") to specified image processing steps as exemplified by color balance adjustment, gradation adjustment, density adjustment, dodging (compression/expansion of the density's dynamic range), saturation adjustment, electronic magnification and sharpening, thereby producing output image data for printing purposes. These steps may be performed by any known methods comprising suitable combinations of arithmetic operations, processing with a lookup table (LUT), matrix (MTX) operations, filtering and so forth. The conditions of these processing steps (for setting a coefficient of an arithmetic operation and constructing a LUT or MTX operation) are set together with the (image) reading conditions for fine scan by the condition setting section 110 to be described below.

The processing subsection 126 is connected to the I/O controller 114. The processed image data is output to the I/O controller 114 with a specified timing after having been temporarily stored as required in the frame memories 128A, 128B and 128C.

As described above, in the photoprinting/developing machine 10 for implementing the reading method of the invention, the image of each frame on the film F is captured by two scans, the first being prescan for reading the image roughly and the second being fine scan for reading the image at high resolution. Further, in prescan mode, the storage time (exposure time) or the reading condition of each pixel line is optically different between the odd pixel lines and the even pixel lines.

The image data obtained by prescan is input from the selector 122 to the I/O controller 114, from which the data is output to the condition setting section 110.

The condition setting section 110 comprises a CPU 130, a RAM 132, a ROM 134 (for example EPROM in which the stored content can be altered), and an I/O port 136. These components are connected to each other via a bus 138. The prescanned data input from the I/O controller 114 is used to extract the data in the area corresponding to the image of each frame on the film, thereby detecting the position of each frame and setting for each frame the image processing conditions and the reading conditions for fine scan by arithmetic operations.

Specifically, prescan reading is performed under a plurality of optically different reading conditions in the input machine 16 (scanner 12) according to the invention, as described above.

First, the condition setting section 110 (CPU 130) uses the image characteristic values of the prescanned image data (or prescanned data) under the individual reading conditions to align the signal level of each prescanned data or absorb the differences due to the individual reading conditions. The thus generated prescanned data is hereinafter referred to as "corrected prescanned data".

In the illustareted case, the storage time of the image sensor 68 is different between the odd pixel lines and the even pixel lines. Then, the image characteristic values of the individual prescanned data are used to absorb the differences in the storage time to thereby generate the corrected prescanned data in which both the pixel lines have an aligned signal level. The thus generated data is output as the so-called prescanned image data for calculating the reading conditions for fine scan and the image processing conditions.

A possible method for aligning the signal level in the image data read under the optically different conditions is to determine the ratio between the different reading conditions (ratio of the storage time in the illustrated case) to absorb the differences. However, there are many cases in which the output from the image sensor does not change linearly with respect to the image density (received light quantity), and in the above method, the obtained prescanned data does not match with the actual image densities in accordance with the properties of the image sensor, especially in the high density (low output) region.

In contrast, the method of the present invention absorbs the differences due to the reading conditions by using the image characteristic value of the prescanned data. Hence, the differences due to the reading conditions can be absorbed properly irrespective of the properties of the image sensor.

The differences in the signal level of individual prescanned data under the plurality of different reading conditions that may be caused by the different reading conditions can include the difference in the storage time of the line CCD sensor or area CCD sensor and the difference in the exposure time. In the present invention however, these can be regarded as the differences in the light quantity between the individual reading conditions, namely the differences in the quantity of the light received by the CCD sensor between the individual reading conditions. It should be noted that the differences in the signal level of individual prescanned data can also be regarded as the positional offsets between the scanning lines due to the line CCD sensor, when reading for the individual scanning lines that are different for each line CCD sensor, for example with the storage time (exposure time) that is different between the odd pixel lines and the even pixel lines. Namely, when taking the odd pixel lines as the reference, the positional offsets between the odd and even pixel lines can be absorbed by creating the image data of the even pixel lines being aligned with the odd pixel lines by interpolation between the even pixel lines, for example using the preceding and following even pixel lines. Thus, the positional offset of the line in the image having only the image data of the odd pixel lines from the corresponding line in the image having only those of the even pixel lines is eliminated, thereby obtaining both images in which all sets of the positions of the corresponding lines are aligned.

Exemplary image characteristic values used for calculating the corrected prescanned data or absorbing the differences due to the reading conditions include a specified % point value in density histograms such as average density and highlight (minimum density), an average value between two specified % points in the density histograms and so forth.

The average value between two specified % points in the density histograms is particularly preferred, and the average value in the low density (high output) region is more preferably used, because the effect of the non-linearity of the I/O properties of the image sensor 68 in the high density region can be reduced. The values to be used as two specified % points are appropriately set in accordance with the properties of the image sensor 68 used, the reading conditions and so forth, with the average value between 10% point and 60% point on the low density side being advantageously illustrated.

The method of calculating the corrected prescanned data using the image characteristic values is not limited in any particular way, and various methods are available in accordance with the image characteristic value used.

For example, when using the average density as the image characteristic value, the corrected image data in each pixel of even pixel lines (corrected prescanned data) represented by image 2' can be calculated by the following equation:

Corrected prescanned data (image 2')

=image 2+(D1–D2)

where image 1, D1, image 2 and D2 represent the image data in each pixel of odd pixel lines, the average density thereof, the image data in each pixel of even pixel lines and the average density thereof, respectively. In the above equation, image 1 is taken as a reference, and D1–D2 represents the differences in the signal level of the image data due to the different reading conditions that is to be absorbed.

The thus obtained corrected prescanned data (image 2') is combined with image 1 taken as the reference and of which the signal level is aligned with that of image 2' by the following equation to calculate the corrected prescanned data (image 3).

Corrected prescanned data (image 3)

=image 1 (odd pixel line)

=image 2 +(D1–D2) (even pixel line)

The thus obtained corrected prescanned data (image 3) can be output as the so-called prescanned image data for calculating the reading conditions for fine scan and the image processing conditions.

When using the average value between two specified % points in the density histogram or the specified % point value of the density histogram, the corrected prescanned data can be also calculated as in the above-mentioned method using the average density. Thus, when taking the odd pixel lines as the reference, differences in the specified % point value or average value of each of the odd and even pixel lines are added to the image data of the even pixel lines as the differences in the signal level of the image data due to the different reading conditions that are to be absorbed thereby calculating the corrected prescanned data.

In the above case, two kinds of image data for the odd and even pixel lines are combined to calculate the corrected prescanned data (image 3) which is then output as the so-called prescanned image data. However, this is not the sole case of the invention, and more optimal prescanned data in the prescanned data (image 1) and the corrected prescanned data (image 2') may be output as the so-called prescanned image data. Alternatively, a selector for prescanned image data may be provided to select the optimal corrected prescanned data or the corrected prescanned data being combined to be output.

When performing prescan under more than two different reading conditions, more than two corrected prescanned data that have absorbed the difference in each signal level and have been corrected to align each signal level (reference prescanned data not being corrected also included). Then, from more than two corected prescanned data, the optimal corrected prescanned data or at least two corrected prescanned data being combined may be output. Further, a selector for prescanned image data may be provided to select whether the optimal corrected prescanned image data or at least two corrected prescanned data being combined are output from more than two corrected prescanned data.

Then, the condition setting section 110 uses the corrected prescanned data to perform various operations including the construction of density histograms and calculation of the image characteristic values such as the specified % point value in density histograms including average density, LATD (large-area transmission density), highlight (minimum density) and shadow (maximum density).

Then, the state of the original image is checked from these results and film information detected from the DX codes or the like read by the carrier 54. The storage time of each line CCD sensor of the image sensor 68 and the stop-down value of the variable diaphragm 48 are calculated so that the output from the image sensor 68 is saturated at a slightly lower density than the minimum density of the original image, and used as the reading conditions for fine scan (hereinafter referred to as "fine reading conditions").

The condition setting section 110 further sets the image processing conditions (hereinafter referred to as "processing conditions") for the gray balance adjustment and the density adjustment of each frame in accordance with not only the density histograms and the image characteristic values obtained from the corrected prescanned data, and the film information but also the operator's instruction by means of the keyboard 24a or the mouse 24b.

In the illustrated input machine 16 (scanner 12), the processing conditions and the fine reading conditions for each frame are set in the order reverse to prescan after prescan is performed for all the frames. Thus, in a preferred embodiment, the processing conditions can be set taking into consideration not only the corrected prescanned data of the frame of interest but also the corrected prescanned data of a plurality of frames, more preferably of all the frames. Hence, more proper processing conditions can be set in accordance with the original image (original type also included) by seizing the base density and other properties of the film F correctly, whereupon high quality output images can be obtained. Further, the present invention performs prescan under a plurality of reading conditions to cover a wide density range, but use of the prescanned data of a plurality of frames does not cause any inconvenience due to the difference in the reading conditions, because the processing conditions are set using the corrected prescanned data described above.

As will be described later in detail, when the image is to be verified, the condition setting section 110 sets the processing conditions and the fine reading conditions, and the thus set processing conditions and the prescanned image data are output to the personal computer 112.

This image is represented as a simulation image on the display 26 connected to the personal computer 112, and the operator corrects as required the image or the processing conditions. The processing conditions are thus finalized.

When the processing conditions are finalized, the condition setting section 110 outputs the finalized processing conditions to the processing subsection 126 of the image processing section 108. The detected position of each frame and the fine reading conditions are output to the microprocessor 72 of the scanner 12.

The microprocessor 72 adjusts the storage time of each line CCD sensor and the stop-down value of the variable diaphragm 48 in accordance with the supplied fine reading conditions of each frame and performs image reading in accordance with the supplied position information of each frame.

The personal computer 112 (hereinafter referred to as "PC" 112) comprises a CPU 140, a memory 142, a hard disk 144, a CD-ROM driver 146, a transport controlling part 148 and an expansion slot 150. These components are connected to each other via a bus 154 to which the above-mentioned keyboard 24a, mouse 24b and display 26 are also connected.

The transport controlling part 148 is connected to the carrier 54 to control the transport of the film F by the carrier 54.

The drive of a recording medium, an information processing unit and a communication device are connected to the PC 112 via the expansion slot 150.

As described above, when the verification is to be performed, the condition setting section 110 sets the processing conditions, and the thus set conditions are output to the PC 112 together with the prescanned data.

The PC 112 processes the prescanned data of each frame under the corresponding processing conditions and the thus processed data is represented as the simulation image on the display 26.

In the verification by the operator, the instruction for image correction is mainly entered by means of a density correction key and a color correction key being set on the keyboard 24a. The PC 112 sets or corrects (changes) the processing conditions in accordance with the entered instruction for correction to change accordingly the simulation image on the display 26 and supplies the condition setting section 110 with the information for image correction. The condition setting section 110 also sets or corrects the processing conditions in accordance with the instruction for correction.

The I/O controller 114 is connected to the printer 18 via an I/F circuit 156.

The output image data for printing purposes that was subjected to the image processing in the image processing section 108 usually output as the output image data from the I/O controller 114 to the printer 18 via the I/F circuit 156. When outputting the image data to an external unit, the image data that was subjected to the image processing in the image processing section 108 is output from the I/O controller 114 to the PC 112 via the condition setting section 110.

The output machine 22 comprises the printer 18 and the processor 20. A light-sensitive material (photographic paper) is exposed in accordance with the image data output from the image processing apparatus 14 in the input machine 16 to record a latent image, which is then subjected to a specified development process, thereby outputting a (finished) print.

The printer 18 exposes cut sheets of the light-sensitive material by scanning with light beams to record latent images. To give one example, the light-sensitive material is cut to a specified length in accordance with the size of the final print; thereafter, the printer 18 records a back print and three light beams for exposure to red (R), green (G) and blue (B) are modulated in accordance with the image data (the image to be recorded); the three modulated light beams are deflected in the main scanning direction and, at the same time, the light-sensitive material is transported in the auxiliary scanning direction perpendicular to the main scanning direction so as to record a latent image by two-dimensional scan exposure with light beams; the thus exposed light-sensitive material is sent to the processor 20, where the supplied light-sensitive material is subjected to a wet development process comprising color development, bleach-fixing and rinsing to render the latent image visible; the thus processed light-sensitive material is then dried to produce a print; a plurality of prints thus produced are sorted and stacked for each film roll.

We now describe the image reading method of the invention in greater detail by explaining the operation of the photoprinting/developing machine 10.

When the photoprinting/developing machine 10 is activated, the carrier 54 adapted for the film F is mounted on a specified position of the operating table 32. Thereafter, whether or not the input machine 16 (scanner 12, image processing apparatus 14) is in a specified state is verified by the light quantity of the light source 36 or other factors, and the film F to be supplied for print preparation is fitted in a specified position of the carrier 54. To give one example, print preparation is performed using a 24-exposure film as the film F.

When the input machine 16 (scanner 12, image processing apparatus 14) is activated and the carrier 54 confirms the film F was fitted therein, the scanner 12 enters the prescan mode in which prescan can be started, and the microprocessor 72 sets the stop-down value of the variable diaphragm 48, the storage time of each line CCD sensor of the image sensor 68 and the like in accordance with the reading conditions for prescan. The storage time of each line CCD sensor is different between the odd pixel lines and the even pixel lines in the auxiliary scanning direction, and prescan reading is performed under a plurality of optically different reading conditions.

At the same time, the casing 56 and the lens unit 64 are moved vertically in accordance with the type of the film F, the print size and so forth to thereby perform magnification adjustment.

When the scanner 12 is in a state adapted for prescan, the carrier 54 starts transporting the film F in the auxiliary scanning direction as shown by the arrow b in FIG. 2A for scanning at a prescan speed. The reading light from the light source 36 has its quantity adjusted by means of the variable diaphragm 48, and is diffused in the light diffuser box 50. The thus diffused reading light is incident on the film F that is transported while being held in the reading position by means of the carrier 54. The image of the film F is two-dimensionally scanned with the reading light in the slit shape. The projected light from the film F is focused by the lens unit 64 to form an image on the image sensor 68. The respective R, G and B line CCD sensors of the image sensor 68 read the image of the film F photoelectrically.

In the illustrated case, prescan is first performed for all the frames. Prescan is performed while continuously transporting the film F until the film F is entirely captured from the 1st to 24th frames.

Parallel to prescan, the carrier 54 reads the DX codes and the like recorded on the film F. In the case of the APS, the carrier 54 also reads the magnetic information recorded on the film F. These are appropriately sent to the processing apparatus 14 where the film information including the film type and the frame number is detected.

The output signals from the image sensor 68 are amplified with the amplifiers 98, converted to digital form in the A/D converters 100, corrected in the CDSs 102 and sent from the I/F circuit 104 to the image processing apparatus 14 as the prescanned data, which is then subjected to the dark correction, deficient pixel correction and brightness correction in the scanner correcting section 106. The selector 122 outputs the corrected prescanned data to the I/O controller 114, through which the data is sent to the condition setting section 110.

In the condition setting section 110, the prescanned data and the film information are used to extract the prescanned data of each frame and the frame position. Then, the average values between two specified % points in the prescanned data of the odd and even pixel lines are calculated for each frame and used to calculate the corrected prescanned data for each frame, as described above.

The condition setting section 110 further uses the thus calculated corrected prescanned data of each frame to perform various operations including the construction of density histograms and calculation of image characteristic values for each frame. The image characterisctic values for all the frames are also used to calculate the film properties including the base density, whereupon the fine reading conditions and the (image) processing conditions for each frame are set, as described above.

In an efficient case, the processing operations are sequentially performed in the order reverse to prescan, that is, from the 24th frame.

When the operator performs verification, the corrected prescanned data and the processing conditions are sequentially sent to the PC 112, where the supplied corrected prescanned data is processed under the corresponding processing conditions, and the thus processed data is sequentially represented on the display 26 as the simulation image for reproducing the processed image on a print.

Looking at the simulation image being represented on the display 26, the operator sequentially performs verification from the 24th frame, and as required, performs image adjustment for each frame using adjustment keys on the keyboard 24a. The previously set processing conditions are accordingly adjusted or corrected, and at the same time, the simulation image represented on the display 26 is also changed.

If the operator finds that the image in the frame of interest is appropriate (the result of the verification is OK), he or she gives an instruction for verification end for this frame and performs verification of the next frame.

When the operator ends verification of a specified number of frames, he or she instructs print start. As the result, the processing conditions of these frames are finalized and the position of each frame, the fine reading conditions and the processing conditions are sent to the processing subsection 126 of the image processing section 108 and to the microprocessor 72 of the scanner 12.

Then, in the scanner 12, the carrier 54 starts transporting the film F in the direction reverse to prescan at a speed adapted for fine scan. Fine scan is sequentially performed from the 24th frame.

On the other hand, at the same time as the instruction for print start, the next simulation image is sequentially represented on the display 26 in accordance with the setting of the processing conditions by the condition setting section 110. The operator performs verification in the same manner and gives an instruction for print start, according to which the processing conditions of these frames are finalized and transferred to a specified site together with the fine reading conditions, and thereafter, fine scan is performed. Thus, verification and fine scan are similarly performed till the 1st frame, whereupon image reading of the film F is finished.

It should be noted that the invention is not limited to the case where the operator always performs verification in the input machine 16 for implementing the image reading method of the invention, and the print may be prepared without performing visual verification. In this case, the image processing conditions are finalized at the point of time when the condition setting section 110 sets the image processing conditions and the fine reading conditions. For example, fine scan starts from the 24th frame at the point of time when the image processing conditions and the fine reading conditions for a specified number of frames are set.

If no verification is to be performed, the simulation image may not be represented on the display 26.

Whether verification should be performed or not is preferably determined in appropriately selectable modes.

In the scanner 12, fine scan is performed in the same manner as prescan except that the pixel density and signal level for reading, reading conditions including the storage time (exposure time) of each line CCD sensor of the image sensor 68 and the direction in which the film F is transported are different.

The fine scanned data output from the scanner 12 is processed in the scanner correcting section 106 and sent to the image processing section 108 by means of the selector 122. The processing subsection 126 subjects the supplied data to image processing under the processing conditions set in accordance with the respective frames to produce output image data, which is then sent from the I/O controller 114 to the printer 18 via the I/F circuit 156.

As described above, the printer 18 having received the output image data records a back print and the light-sensitive material is exposed for scanning with the light beams modulated in accordance with the image data to form a latent image, which is then transported to the processor 20.

The light-sensitive material exposed and transported to the processor 20 is subjected to a wet development process and specified processing steps such as drying to produce a finished print; a plurality of prints thus produced are sorted and stacked.

In the above-mentioned input machine 16, the image reading method of the invention is applied to prescan in the system that uses the scanner 12 to perform fine scan in which the original image is read at high resolution to obtain the output image data for printing purposes and prescan in which it is read at low resolution prior to fine scan to determine the fine reading conditions and the image processing conditions. However, the present invention is not limited to this sole case, and may be applied to the first fine scan for determining the reading conditions for the second fine scan and the image processing conditions in a system in which fine scan for reading the original image at high resolution is performed twice. Alternatively, the present invention may be applied to the system in which fine scan for reading the original image at high resolution is performed only once. It should be noted that, in the latter case, the corrected fine scanned image data obtained by applying the present invention to the fine scanned image data previously obtained can be used to determine the image processing conditions, which are then applied to the corrected fine scanned image data to generate the output image data for printing purposes.

While the image reading method of the present invention has been described above in detail, it should be noted that the invention is by no means limited to the foregoing embodiments and various improvements and modifications may of course be made without departing from the scope and spirit of the invention.

As described above in detail, in the image reading method of the present invention, prescan is performed under a plurality of reading conditions different in the light quantity to cover the wide density range. In image reading for determining the reading conditions for fine scan and the image processing conditions, the thus obtained prescanned data can be used to absorb advantageously the differences in the prescanned data due to different reading conditions, thereby setting the proper reading conditions and image processing conditions in a consistent manner, even when these conditions are to be set for each frame from the prescanned data of a plurality of frames.

What is claimed is:

1. An image reading method comprising the steps of:

reading an original image photoelectrically under a plurality of reading conditions different in light quantity;

obtaining image characteristic values of said original image for said individual reading conditions from image signals read under said individual reading conditions; and absorbing differences in signal level of said image signals under said individual reading conditions using said image characteristic values obtained under said individual reading conditions to thereby align the signal level of said image signals under said individual reading conditions.

2. The image reading method according to claim 1, wherein said image characteristic values include at least one of an average value in a specified range and a specified point value in a cumulative histogram of said image signals, and an average value of said image signals.

3. The image reading method according to claim 1, wherein said differences in said signal level of said image signals are those in the light quantity between said reading conditions.

4. The image reading method according to claim 1, wherein at least one of a number of reading and a color for reading said original image several times is changed over in accordance with an original type of said original image as said reading conditions for reading said original image several times.

5. The image reading method according to claim 1, wherein a line sensor is used to read said original image photoelectrically under said plurality of reading conditions different in the light quantity to thereby read it with an exposure time that is different between specified lines.

6. The image reading method according to claim 5, wherein said differences in the signal level of said image signals are positional offsets between said lines due to said line sensor.

7. The image reading method according to claim 1, further comprising the step of:

selecting one optimal corrected image signal to be output or at least two corrected image signals being combined to be output from a plurality of corrected image signals obtained by aligning the signal level of said image signals under said individual reading conditions.

8. The image reading method according to claim 1, wherein reading said original image photoelectrically under the plurality of reading conditions different in the light quantity to thereby align the signal level of said image signals under said individual reading conditions is performed in prescan prior to fine scan that reads said original image photoelectrically to obtain output image signals.

9. The image reading method according to claim 8, further comprising the step of:

determining at least one of reading conditions for said fine scan and image processing conditions for image processing schemes to be performed on fine scanned image signals obtained by said fine scan by using corrected prescanned image signals obtained by aligning the signal level of said image signals under said individual reading conditions in said prescan.

10. The image reading method according to claim 9, further comprising the step of:

selecting one optimal corrected image signal to be output or at least two corrected image signals being combined to be output from a plurality of corrected image signals as said corrected prescanned image signals, which are obtained by aligning the signal level of said image signals under said individual reading conditions.

11. The image reading method according to claim 1, wherein said image signals are digital density signals.

12. An image reading method for reading an original image photoelectrically, comprising the steps of:

performing prescan under a plurality of reading conditions different in light quantity prior to fine scan for obtaining output image signals;

using image characteristic values of an image obtained by said prescan to absorb differences of prescanned image signals due to said different reading conditions; and determining at least one of reading conditions for said fine scan and image processing conditions for image processing schemes to be performed on the image signals obtained by said fine scan using corrected prescanned image signals having adsorbed the differences of said image signals.

13. The image reading method according to claim 12, wherein said image characteristic values include at least one of an average value of said image signals between two specified % points in a histogram, a specified % point value of said image signals in the histogram, and an average value of said image signals.

* * * * *